(12) United States Patent
Kim et al.

(10) Patent No.: US 10,290,826 B2
(45) Date of Patent: May 14, 2019

(54) ORGANIC LIGHT EMITTING DISPLAY DEVICE AND LIGHTING APPARATUS FOR VEHICLES USING THE SAME

(71) Applicant: LG DISPLAY CO., LTD., Seoul (KR)

(72) Inventors: JiYoung Kim, Seongnam-si (KR); Jaeil Song, Paju-si (KR); Younseok Kam, Seoul (KR); Taeshick Kim, Yongin-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/169,269

(22) Filed: May 31, 2016

(65) Prior Publication Data

US 2017/0077434 A1     Mar. 16, 2017

(30) Foreign Application Priority Data

Sep. 11, 2015   (KR) .......................... 10-2015-0128764

(51) Int. Cl.
*H01L 51/50*    (2006.01)
*H01L 51/52*    (2006.01)
*H01L 27/32*    (2006.01)

(52) U.S. Cl.
CPC ........ *H01L 51/504* (2013.01); *H01L 27/3209* (2013.01); *H01L 51/5036* (2013.01); *H01L 51/5056* (2013.01); *H01L 51/5072* (2013.01); *H01L 51/5206* (2013.01); *H01L 51/5221* (2013.01); *H01L 51/5278* (2013.01); *H01L 2251/5384* (2013.01); *H01L 2251/556* (2013.01)

(58) Field of Classification Search
CPC ....................................................... H01L 51/50
USPC .......................................................... 257/40
See application file for complete search history.

(56) References Cited

U.S. PATENT DOCUMENTS

| 8,350,257 B2 | 1/2013 | Pieh et al. | |
| 2005/0112401 A1* | 5/2005 | Lee ..................... | C07F 15/0033 428/690 |
| 2007/0122655 A1* | 5/2007 | Deaton .................. | C09K 11/06 428/690 |

(Continued)

FOREIGN PATENT DOCUMENTS

| CN | 102224591 A | 10/2011 |
| CN | 103872253 A | 8/2014 |

(Continued)

*Primary Examiner* — Sheng-Bai Zhu
(74) *Attorney, Agent, or Firm* — Birch, Stewart, Kolasch & Birch, LLP

(57) ABSTRACT

Discussed is an organic light emitting display device. The organic light emitting display device according to an embodiment includes a first emission part between a first electrode and a second electrode and a second emission part on the first emission part. The first emission part includes a first hole transport layer, a first emission layer, and a first electron transport layer, and the second emission part includes a second hole transport layer, a second emission layer, and a second electron transport layer. The second emission layer includes at least two zones including a hole-type host and an electron-type host, and a zone among the at least two zones closer to the first electrode than the second electrode, a ratio of the mixed host to the electron-type host is higher than a ratio of the mixed host to the hole-type host in the zone.

21 Claims, 7 Drawing Sheets

(56) References Cited

U.S. PATENT DOCUMENTS

| | | | |
|---|---|---|---|
| 2009/0026939 A1* | 1/2009 | Kinoshita | H01L 51/5012 |
| | | | 313/504 |
| 2010/0079066 A1* | 4/2010 | Nomura | C07D 401/10 |
| | | | 313/504 |
| 2010/0090620 A1 | 4/2010 | Hack et al. | |
| 2012/0205687 A1* | 8/2012 | Yamazaki | H01L 51/5016 |
| | | | 257/89 |
| 2013/0320837 A1* | 12/2013 | Weaver | H05B 33/14 |
| | | | 313/504 |
| 2014/0014933 A1 | 1/2014 | Sasaki et al. | |
| 2014/0034924 A1 | 2/2014 | Kawata et al. | |
| 2014/0034927 A1 | 2/2014 | Seo et al. | |
| 2014/0124766 A1* | 5/2014 | Song | H01L 51/5004 |
| | | | 257/40 |
| 2014/0167016 A1 | 6/2014 | Yoo et al. | |
| 2015/0102331 A1 | 4/2015 | Seo et al. | |
| 2015/0155513 A1 | 6/2015 | Pieh et al. | |
| 2015/0279909 A1* | 10/2015 | Tsuji | H01L 51/504 |
| | | | 257/40 |
| 2016/0064684 A1* | 3/2016 | Seo | H01L 51/5016 |
| | | | 257/40 |

FOREIGN PATENT DOCUMENTS

| | | |
|---|---|---|
| KR | 10-2011-0035048 A | 4/2011 |
| WO | WO 2010/026859 A1 | 3/2010 |

\* cited by examiner

ORGANIC LIGHT EMITTING DISPLAY DEVICE AND LIGHTING APPARATUS FOR VEHICLES USING THE SAME

CROSS-REFERENCE TO RELATED APPLICATIONS

This application claims the benefit of the Korean Patent Application No. 10-2015-0128764 filed on Sep. 11, 2015, which is hereby incorporated by reference as if fully set forth herein.

BACKGROUND

Field

The present disclosure relates to an organic light emitting display device, and more particularly, to an organic light emitting display device and a lighting apparatus for vehicles using the same, which maintain enhanced lifetime at a room temperature and a high temperature.

Discussion of the Related Art

Recently, as the society advances to the information-oriented society, the field of display devices which visually express an electrical information signal is rapidly advancing. Various display devices having excellent performance in terms of thinness, lightness, and low power consumption are being developed correspondingly.

Examples of the display devices include liquid crystal display (LCD) devices, plasma display panel (PDP) devices, field emission display (FED) devices, organic light emitting display devices (OLED), etc.

Particularly, the organic light emitting display devices are self-emitting devices. In comparison with other display devices, the organic light emitting display devices have a fast response time, high emission efficiency, high luminance, and a wide viewing angle and thus are attracting much attention.

A white organic light emitting device having a stack structure is discussed in Korean Patent Application No. 10-2009-0092596, now published as KR 10-2011-0035048.

SUMMARY

Organic light emitting devices each include an emission layer which is formed between two electrodes. An electron and a hole are injected from the two electrodes into the emission layer, and an exciton is generated by combining the electron with the hole. The organic light emitting devices are devices based on the principle that light is emitted when the generated exciton is dropped from an excited state to a ground state.

Organic light emitting display devices each including an organic light emitting device are being developed as display devices which are available at a room temperature, but need characteristic which is available even at a high temperature so as to be applied to display devices for vehicles and maintains lifetime despite a temperature change of a room-temperature and high-temperature environment.

Moreover, the emission layer included in each of the organic light emitting devices includes a hole-type host, an electron-type host, and a dopant. A mobility of electrical charges injected into the hole-type host and the electron-type host is changed depending on a temperature, and an emission zone or a recombination zone which is an exciton generation zone where an electron and a hole are combined deviates from a center zone of the emission layer at a high temperature unlike a room temperature. For this reason, since the recombination zone or the emission zone is not located in the emission layer, the emission layer cannot emit light. That is, the emission layer cannot contribute to emit light, causing a reduction in lifetime of organic light emitting display devices.

Therefore, the inventors recognize the above-described problems and have done various experiments for improving lifetime of an organic light emitting display device by adjusting a ratio of hosts of an emission layer which configures the organic light emitting display device. Through the various experiments, the inventors have invented a new organic light emitting display device and a lighting apparatus for vehicles using the same, which maintain enhanced lifetime at a room temperature and a high temperature by differently adjusting a ratio of dopants included in an emission layer.

An aspect of the present disclosure is directed to provide an organic light emitting display device and a lighting apparatus for vehicles using the same, which maintain enhanced lifetime at a room temperature and a high temperature.

The objects of the present disclosure are not limited to the aforesaid, but other objects not described herein will be clearly understood by those skilled in the art from descriptions below.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided an organic light emitting display device that includes a first emission part between a first electrode and a second electrode, the first emission part including a first hole transport layer, a first emission layer, and a first electron transport layer, and a second emission part on the first emission part, the second emission part including a second hole transport layer, a second emission layer, and a second electron transport layer, wherein the second emission layer includes at least two zones including a mixed host having a hole-type host and an electron-type host, and a zone among the at least two zones is closer to the first electrode than the second electrode, and a ratio of the mixed host to the electron-type host is higher than a ratio of the mixed host to the hole-type host in the zone.

Another zone among the least two zones may be closer to the second electrode than the first electrode, a ratio of the mixed host to the hole-type host may be equal to or higher than a ratio of the mixed host to the electron-type host.

The first emission layer may include one among a blue emission layer, a sky blue emission layer, and a deep blue emission layer, and the second emission layer may include one among a yellow-green emission layer and a green emission layer.

At least one of the first electrode and the second electrode may include a semitransmissive electrode.

The organic light emitting display device may further include a third emission part on the second emission part, the third emission part including a third hole transport layer, a third emission layer, and a third electron transport layer.

The third emission layer may include one among a blue emission layer, a sky blue emission layer, and a deep blue emission layer.

In another aspect of the present disclosure, there is provided an organic light emitting display device that includes a first layer on a first electrode, the first layer including a first hole transport layer, a first emission layer, and a first electron transport layer, a second layer on the first layer, the second layer including a second hole transport layer, a second emission layer, and a second electron transport layer, and a second electrode on the second layer, wherein the second emission layer includes at least two zones including a hole-type host and an electron-type host and a ratio of the mixed host to the hole-type host differs from a ratio of the mixed host to the electron-type host in the at least two zones so as not to be reduced lifetime of the first emission layer or the second emission layer despite a temperature change of a room-temperature and high-temperature environment.

A zone among the at least two zones may be closer to the first electrode than the second electrode, and a ratio of the mixed host to the electron-type host may be higher than a ratio of the mixed host to the hole-type host in the zone.

Another zone among the at least two zones may be closer to the second electrode than the first electrode, and a ratio of the mixed host to the hole-type host may be equal to or higher than a ratio of the mixed host to the electron-type host in another zone.

The first emission layer may include one among a blue emission layer, a sky blue emission layer, and a deep blue emission layer, and the second emission layer may include one among a yellow-green emission layer and a green emission layer.

At least one of the first electrode and the second electrode may include a semitransmissive electrode.

The temperature may be 25° C. to 105° C.

The organic light emitting display device may further include: a third layer on the second layer, the third layer including a third hole transport layer, a third emission layer, and a third electron transport layer.

The third emission layer may include one among a blue emission layer, a sky blue emission layer, and a deep blue emission layer.

In another aspect of the present disclosure, there is provided a lighting apparatus for vehicles that includes an organic light emitting device including a hole transport layer, an emission layer, and an electron transport layer between an anode and a cathode, wherein the emission layer includes at least two zones including a hole-type host and an electron-type host and i a ratio of the mixed host to the hole-type host differs from a ratio of the mixed host to the electron-type host in the at least two zones so as not to be reduced lifetime of the emission layer despite a temperature change of a room-temperature and high-temperature environment relevant to vehicles.

A zone among the at least two zones may be closer to the anode than the cathode, a ratio of the mixed host to the electron-type host may be higher than a ratio of the mixed host to the hole-type host in the zone.

Another zone among the two zones may be closer to the cathode than the anode, a ratio of the mixed host to the hole-type host may be equal to or higher than a ratio of the mixed host to the electron-type host in another zone.

One among the anode and the cathode may include a semitransmissive electrode.

The temperature may be 25° C. to 105° C.

Details of embodiments are included in a detailed description and the drawings.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE ILLUSTRATED EMBODIMENTS

Figure 1:
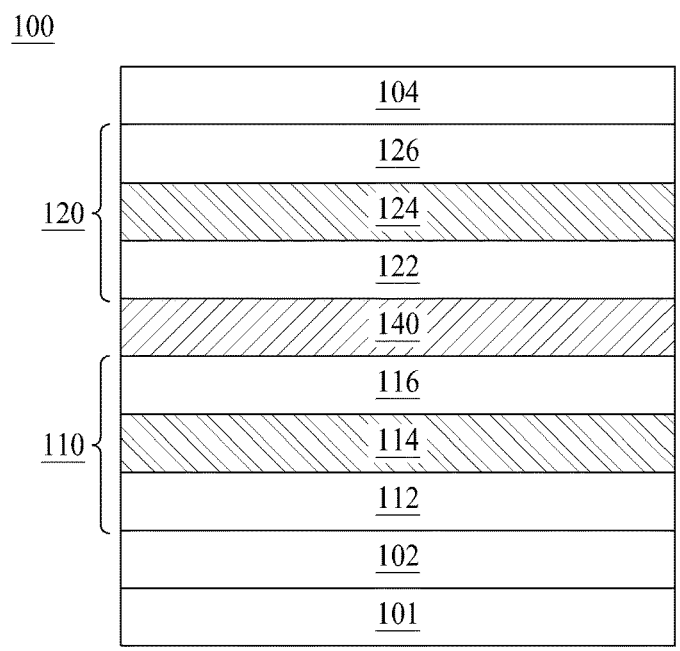
FIG. 1 is a diagram illustrating an organic light emitting device according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted or minimized. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings.

FIG. 1 is a diagram illustrating an organic light emitting device 100 according to an embodiment of the present disclosure. All the components of the organic light emitting device according to all the embodiments of the present disclosure are operatively coupled and configured.

The organic light emitting device 100 according to an embodiment of the present disclosure illustrated in FIG. 1 may include a substrate 101, first and second electrodes 102 and 104, and first and second emission parts 110 and 120 between the first and second electrodes 102 and 104.

The first emission part 110 may include a first hole transport layer (HTL) 112, a first emission layer (EML) 114, and a first electron transport layer (ETL) 116 which are disposed on the first electrode 102. A hole supplied through the first HTL 112 and an electron supplied through the first ETL 116 may be recombined in the first EML 114 to generate an exciton. A zone where the exciton is generated may be referred to as a recombination zone or an emission zone (an emission area).

The second emission part 120 may include a second HTL 122, a second EML 124, and a second ETL 126 which are disposed on the first emission part 110. A hole supplied through the second HTL 122 and an electron supplied through the second ETL 126 may be recombined in the second EML 124 to generate an exciton. A zone where the exciton is generated may be referred to as a recombination zone or an emission zone (an emission area).

A charge generation layer (CGL) 140 may be further provided between the first emission part 110 and the second emission part 120. The CGL 140 may adjust a charge balance between the first emission part 110 and the second emission part 120.

Moreover, the first EML 114 may be formed as a blue EML, and the second EML 124 may be formed as a yellow-green EML. The yellow-green EML may be a phosphorescence EML and is better in efficiency but is shorter in lifetime than the blue EML which is a fluorescence EML. A hole-type host and an electron-type host may be applied for enhancing lifetime of the second EML 124. However, a carrier mobility of the hole-type host and the electron-type host is affected by a temperature. Particularly, the inventors have recognized that an emission zone deviates from a desired zone due to a change in carrier mobility in a high temperature rather than a room temperature, thus lifetime is reduced. For this reason, since a balance of electrons and holes in an emission layer is affected by a temperature, the inventors have reviewed a change in carrier mobility of the emission layer, for checking a change in carrier mobility of hosts included in the emission layer depending on a temperature. Therefore, in order to check a change in mobility of a hole in the emission layer, the inventors have implemented a hole-dominant device and have done an experiment for checking a change in carrier mobility caused by a temperature. Also, in order to check a change in mobility of an electron in the emission layer, the inventors have implemented an electron-dominant device and have done an experiment for checking a change in carrier mobility caused by a temperature. This will be described below with reference to FIGS. 2 and 3.

Figure 2:
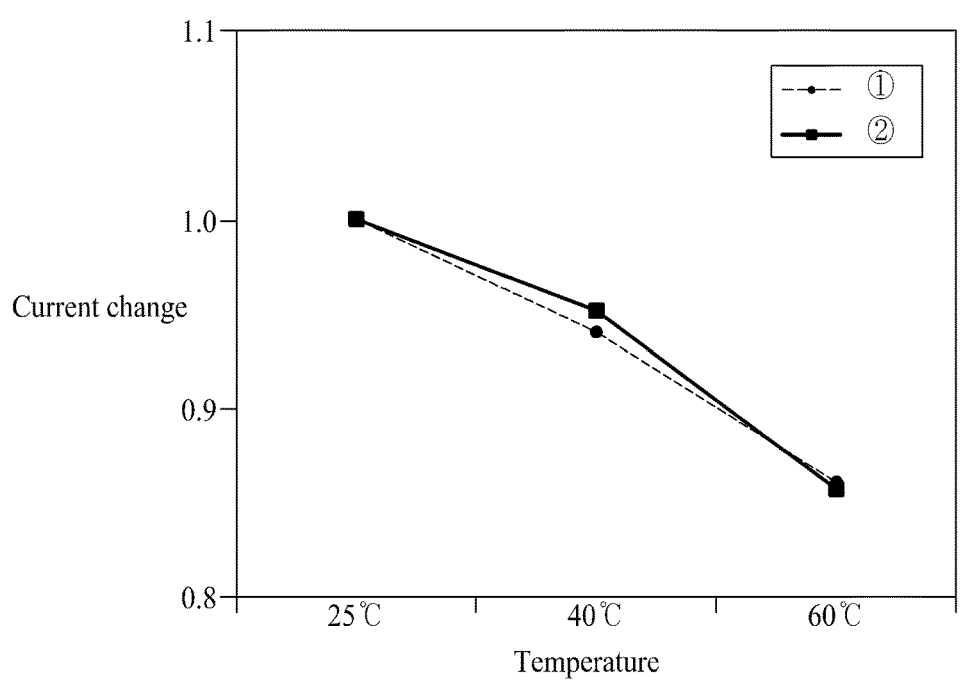
FIG. 2 is a diagram showing a current change amount with respect to a temperature in a hole-dominant device.

FIG. 2 is a diagram showing a current change amount with respect to a temperature in a hole-dominant device.

In FIG. 2, the hole-dominant device may be implemented and may be configured with first electrode/HTL/EML/second electrode. Here, the EML may be a yellow-green EML.

In FIG. 2, the abscissa axis indicates a temperature (° C.), and the ordinate axis indicates a current change amount (J). FIG. 2 shows a result which is obtained by measuring a current change amount at 25° C. to 60° C. The current change amount (J) may be a numerical value which is represented by a relative value with respect to 1.0 J which is a maximum value. Also, a hole-type host is referred to by ①, and an electron-type host is referred to by ②.

As shown in FIG. 2, it can be seen that even though a temperature increases, the current change amount is almost identically changed in the hole-type host and the electron-type host. Therefore, it can be seen that in the hole-type host and the electron-type host, carrier mobility is not changed depending on a temperature. Also, it can be seen that there is no difference in change amount of carrier mobility at a high temperature.

Figure 3:
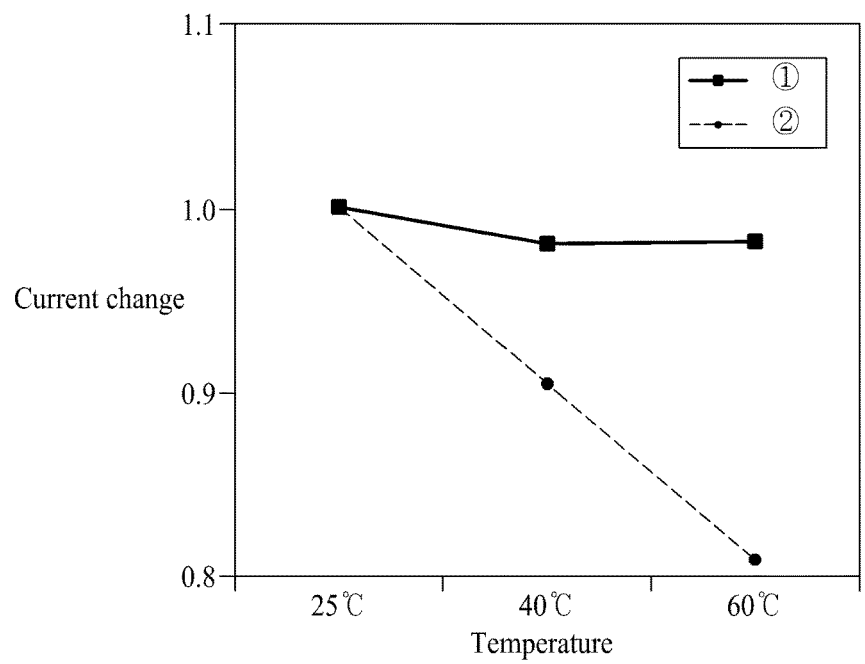
FIG. 3 is a diagram showing a current change amount with respect to a temperature in an electron-dominant device.

FIG. 3 is a diagram showing a current change amount with respect to a temperature in an electron-dominant device.

In FIG. 3, the electron-dominant device may be implemented and may be configured with first electrode/electron injection layer (EIL)/EML/EIL/second electrode. Here, the EML may be a yellow-green EML. Also, the EIL between the EML and the second electrode may act as a hole blocking layer (HBL).

In FIG. 3, the abscissa axis indicates a temperature (° C.), and the ordinate axis indicates a current change amount (J). FIG. 3 shows a result which is obtained by measuring a current change amount at 25° C. to 60° C. The current change amount (J) may be a numerical value which is represented by a relative value with respect to 1.0 J which is a maximum value. Also, a hole-type host is referred to by ①, and an electron-type host is referred to by ②.

As shown in FIG. 3, it can be seen that as a temperature increases, the current change amount is changed greater than FIG. 2. It can be seen that in a hole-type host, carrier mobility is not changed depending on a temperature. However, it can be seen that in an electron-type host, carrier mobility is largely changed depending on a temperature. That is, it can be seen that as a temperature increases from 25° C. to 60° C., a difference in change amount of carrier mobility is larger in the electron-type host than the hole-type host.

Therefore, based on an experiment result of carrier mobility of a hole and an electron with respect to a temperature, the inventors have invented a new organic light emitting display device and a lighting apparatus for vehicles using the same, in which a ratio of the mixed host to the electron-type host included in an EML is differently adjusted rather than a ratio of the mixed host to the hole-type host included in the EML in consideration of the temperature dependency of electrons rather than holes.

Figure 4:
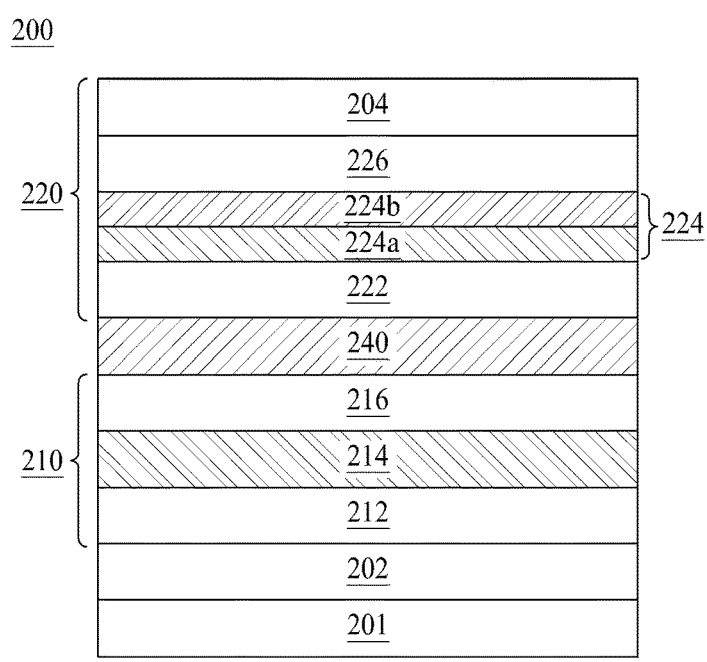
FIG. 4 is a diagram illustrating an organic light emitting device according to a first embodiment of the present disclosure.

FIG. 4 is a diagram illustrating an organic light emitting device 200 according to a first embodiment of the present disclosure.

The organic light emitting device 200 according to the first embodiment of the present disclosure illustrated in FIG. 2 may include a substrate 201, first and second electrodes 202 and 204, and first and second emission parts 210 and 220 between the first and second electrodes 202 and 204.

The substrate 201 may be formed of an insulating material or a material having flexibility. The substrate 201 may be formed of glass, metal, plastic, and/or the like, but is not limited thereto. If an organic light emitting display device is a flexible organic light emitting display device, the substrate 201 may be formed of a flexible material such as plastic and/or the like. Also, if an organic light emitting device which is easy to realize flexibility is applied to a lighting device for vehicles, various designs and a degree of freedom of design of a light device for vehicles are secured according to a structure or an appearance of a vehicle.

The first electrode 202 is an anode that supplies a hole, and may be formed of indium tin oxide (ITO), indium zinc oxide (IZO), or the like which is a transparent conductive material such as transparent conductive oxide (TCO).

The second electrode 204 is a cathode that supplies an electron, and may be formed of gold (Au), silver (Ag), aluminum (Al), molybdenum (Mo), magnesium (Mg), and/or the like which is a metal material, or may be formed of an alloy thereof. However, the present embodiment is not limited thereto.

The first electrode 202 may be referred to as an anode and the second electrode 204 may be referred to as a cathode. Alternatively, the first electrode 202 may be formed as a transmissive electrode, and the second electrode 204 may be formed as a reflective electrode. Alternatively, the first electrode 202 may include a transparent electrode, and the second electrode 204 may include a reflective electrode. Alternatively, the first electrode 202 may be formed as a transmissive electrode, and the second electrode 204 may be formed as a semitransmissive electrode. Alternatively, the first electrode 202 may be formed as a reflective electrode, and the second electrode 204 may be formed as a semitransmissive electrode. Alternatively, the first electrode 202 may be formed as a semitransmissive electrode, and the second electrode 204 may be formed as a transmissive electrode. Alternatively, at least one of the first and second electrodes 202 and 204 may be formed as a semitransmissive electrode.

The first emission part 210 may include a first hole transport layer (HTL) 212, a first emission layer (EML) 214, and a first electron transport layer (ETL) 216 which are disposed on the first electrode 202. That is, a first layer which includes the first HTL 212, the first EML 214, and the first ETL 216 may be formed on the first electrode 202.

A hole injection layer (HIL) may be further formed on the first electrode 202. The HIL enables a hole, supplied from the first electrode 202, to be smoothly injected into the first HTL 212.

The first HTL 212 may supply a hole, supplied from the HIL, to the first EML 214. The first ETL 216 may supply an electron, supplied from the second electrode 204, to the first EML 214. Therefore, a hole supplied through the first HTL 212 and an electron supplied through the first ETL 216 may be recombined in the first EML 214 to generate an exciton. A zone where the exciton is generated may be referred to as a recombination zone or an emission zone (an emission area).

The first ETL 216 may be formed of two or more layers or two or more materials. An electron injection layer (EIL) may be further formed on the first ETL 216.

A hole blocking layer (HBL) may be further formed on the first EML 214. The HBL prevents a hole, injected into the first EML 214, from being transferred to the first ETL 216 and thus enhances a combination of an electron and a hole in the first EML 214, thereby enhancing the emission efficiency of the first EML 214. The first ETL 216 and the HBL may be provided as one layer.

An electron blocking layer (EBL) may be further formed under the first EML 214. The EBL prevents an electron, injected into the first EML 214, from being transferred to the first HTL 212 and thus enhances a combination of an electron and a hole in the first EML 214, thereby enhancing the emission efficiency of the first EML 214. The first HTL 212 and the EBL may be provided as one layer.

The first EML 214 may be an emission layer emitting light having a first color. That is, the first EML 214 may include one among a blue emission layer, a deep blue emission layer, and a sky blue emission layer. An emission zone of the first EML 214 may be within a range of 440 nm to 480 nm.

The first EML 214 may be formed of a blue emission layer which includes an auxiliary emission layer emitting light having a color different from that of light emitted from the blue emission layer. The auxiliary emission layer may be configured with one among a yellow-green emission layer and a red emission layer, or may be configured by a combination thereof. When the auxiliary emission layer is further provided, green or red efficiency can be further improved. When the first EML 214 is provided along with the auxiliary emission layer, the yellow-green emission layer, the red emission layer, or a green emission layer may be disposed on or under the blue emission layer. Also, the yellow-green emission layer, the red emission layer, or the green emission layer may be identically or differently provided as the auxiliary emission layer on and under the blue emission layer. The positions or number of emission layers may be selectively determined depending on a structure and a characteristic of a device, but the present embodiment is not limited thereto.

When the first EML 214 includes the yellow-green emission layer which is the auxiliary emission layer, an emission zone of the first EML 214 may be within a range of 440 nm to 590 nm. Also, when the first EML 214 includes the red emission layer which is the auxiliary emission layer, the emission zone of the first EML 214 may be within a range of 440 nm to 650 nm. Also, when the first EML 214 includes the yellow-green emission layer and the red emission layer which configure the auxiliary emission layer, the emission zone of the first EML 214 may be within a range of 440 nm to 650 nm. Therefore, the first EML 214 may include one of a blue emission layer, a deep blue emission layer, a sky blue emission layer, a combination of a red emission layer and one among a blue emission layer, a deep blue emission layer and a sky blue emission layer, and a combination of a yellow-green emission layer and one among a blue emission layer, a deep blue emission layer and a sky blue emission layer.

The first EML 214 may include at least one host and dopant. Alternatively, the first EML 214 may include a mixed host, where two or more hosts are mixed, and at least one dopant. The mixed host may include a hole-type host and an electron-type host.

The first HTL 212, the first EML 214, the first ETL 216, the HIL, the EIL, the HBL, and the EBL may each be referred to as an organic layer.

The second emission part 220 may include a second HTL 222, a second EML 224, and a second ETL 226 which are disposed on the first emission part 210. Alternatively, a second layer which includes the second HTL 222, the second EML 224, and the second ETL 226 may be disposed on the first layer which includes the first HTL 212, the first EML 214, and the first ETL 216. The second electrode 204 may be formed on the second layer. A hole supplied through the second HIL 222 and an electron supplied through the second ETL 226 may be recombined in the second EML 224 to generate an exciton. A zone where the exciton is generated may be referred to as a recombination zone or an emission zone (an emission area).

An EIL may be further formed on the second ETL 226. Also, an HIL may be further formed under the second HTL 222.

An HBL may be further formed on the second EML 224. The HBL prevents a hole, injected into the second EML 224, from being transferred to the second ETL 226 and thus enhances a combination of an electron and a hole in the second EML 224, thereby enhancing the emission efficiency of the second EML 224. The second ETL 226 and the HBL may be provided as one layer.

An EBL may be further formed under the second EML 224. The EBL prevents an electron, injected into the second EML 224, from being transferred to the second HTL 222 and thus enhances a combination of an electron and a hole in the second EML 224, thereby enhancing the emission efficiency of the second EML 224. The second HTL 222 and the EBL may be provided as one layer.

The second EML 224 may be an emission layer emitting light having a second color. That is, the second EML 224 may include one of a yellow-green emission layer and a green emission layer. When the second EML 224 is the yellow-green emission layer, an emission zone of the second EML 224 may be within a range of 510 nm to 590 nm. Also, when the second EML 224 is the green emission layer, the emission zone of the second EML 224 may be within a range of 510 nm to 580 nm.

The second EML 224 may include at least one host and dopant. The at least one host may include a hole-type host or an electron-type host. Also, the second EML 224 may include at least two zones where a ratio of the mixed host to the hole-type hosts differs from a ratio of the mixed host to the electron-type host. In FIG. 4, the second EML 224 is illustrated as including two zones, but the present embodiment is not limited thereto. In another embodiment, the second EML 224 may include three or more zones. Accordingly, in the second EML 224, a ratio of the mixed host to the hole-type host and a ratio of the mixed host to the electron-type host included in at least two zones may be differently adjusted.

A first zone 224a of the at least two zones may be a zone close to the first electrode 202 through which a hole is transported, and a second zone 224b of the at least two zones may be a zone close to the second electrode 204 through which an electron is transported. Alternatively, the first zone 224a of the at least two zones may be a zone adjacent to the second HTL 222, and the second zone 224b of the at least two zones may be a zone adjacent to the second ETL 226. As a temperature increases to a high temperature, electrical charges are excessively concentrated on the first zone 224a, and the number of electrons supplied to the second zone 224b increases. To solve such a problem, a ratio of the mixed host to the hole-type host and a ratio of the mixed host to the electron-type host may be differently adjusted in the first zone 224a and the second zone 224b. That is, in the first zone 224a, a ratio of the mixed host to the electron-type host where a change amount of mobility caused by a temperature is large may be adjusted higher than a ratio of the mixed host to the hole-type host. Therefore, the first zone 224a may control the number of increased holes, and thus, electrons which are transferred from the second zone 224b and are concentrated on the first zone 224a are effectively dispersed to the second zone 224b, thereby achieving a balance of electrons and holes in the second EML 224. In the second zone 224b, a ratio of the mixed host to the hole-type host may be adjusted equal to or higher than a ratio of the mixed host to the electron-type host. Therefore, the second zone 224b may minimize the number of increased electrons, and thus, holes in the first zone 224a are effectively dispersed to the second zone 224b, thereby achieving a balance of electrons and holes in the second EML 224.

Therefore, a ratio of the mixed host to the electron-type host may be adjusted higher than a ratio of the mixed host to the hole-type host in the first zone 224a adjacent to the second HTL 222, and thus, the number of increased holes in the first zone 224a may be controlled, whereby electrons which are transferred from the second zone 224b and are concentrated on the first zone 224a are effectively dispersed to the second zone 224b. Also, a ratio of the mixed host to the hole-type host may be adjusted equal to or higher than a ratio of the mixed host to the electron-type host in the second zone 224b adjacent to the second ETL 226, and thus, the number of increased electrons in the second zone 224b may be controlled, whereby holes in the first zone 224a are effectively dispersed to the second zone 224b. Therefore, the second EML 224 may maintain a balance of electrons and holes at a room temperature and a high temperature, and thus may contribute to emit light, thereby enhancing lifetime.

Alternatively, in the first zone 224a of the second EML 224 close to the first electrode 202 through which a hole is transported, a ratio of the mixed host to the electron-type host may be adjusted higher than a ratio of the mixed host to the hole-type host. Also, in the second zone 224b of the second EML 224 close to the second electrode 204 through which an electron is transported, a ratio of the mixed host to the hole-type host may be adjusted equal to or higher than a ratio of the mixed host to the electron-type host. Accordingly, a ratio of electrons and holes may be adjusted, and thus, an emission zone of the second EML 224 is optimized, thereby enhancing lifetime at a high temperature.

Alternatively, in the first zone 224a of the second EML 224 close to the second HTL 222, a ratio of the mixed host to the electron-type tests may be adjusted higher than a ratio of the mixed host to the hole-type host. Also, in the second zone 224b of the second EML 224 close to the second ETL 226, a ratio of the mixed host to the hole-type host may be adjusted equal to or higher than a ratio of the mixed host to the electron-type host. Accordingly, a ratio of electrons and holes may be adjusted, and thus, the emission zone of the second EML 224 is optimized, thereby enhancing lifetime at a high temperature.

The hole-type host may use, for example, 4,4'-bis(carbozol-9-yl)biphenyl (CBP), N,N'-bis(naphthalene-1-yl)-N,N'-bis(phenyl)-benzidine (NPB), 4,4',4''-tris(carbozol-9-yl)triphenylmine (TcTa), etc., but is not limited thereto. The electron-type host may use, for example, 4,6-bis(3,5-di(pyridine-3-yl)phenyl)-2-methylpyrimidine (B3PYMPM), 2,2',2''-(1,3,5-benzinetriyl)-tris(1-phenyl-1-H-benzimidazole (TPBi), tris(2,4,6-trimethyl-3-(pyridine-3-yl)phenyl) borane (3TPYMB), 1,3-bis [3,5-di(pyridine-3-yl)phenyl] benzene (BmPyPhB), etc., but is not limited thereto.

The second HTL 222, the second EML 224, the second ETL 226, the HIL, the EIL, the HBL, and the EBL may each be referred to as an organic layer.

A charge generation layer (CGL) 240 may be further provided between the first emission part 210 and the second emission part 220. Alternatively, the CGL 240 may be further provided between the first layer, including the first HTL 212, the first EML 214, and the first ETL 216, and the second layer which includes the second HTL 222, the second EML 224, and the second ETL 226. The CGL 240 may adjust a charge balance between the first emission part 210 and the second emission part 220.

The CGL 240 may include an N-type CGL and a P-type CGL. The N-type CGL may inject an electron into the first emission part 210. The N-type CGL may be formed as an organic layer which is doped with alkali metal such as lithium (Li), sodium (Na), potassium (K), or cesium (Cs) or alkali earth metal such as magnesium (Mg), strontium (Sr), barium (Ba), or radium (Ra), but is not limited thereto. The P-type CGL may inject a hole into the second emission part 220. The P-type CGL may be formed as an organic layer including a P-type dopant, but is not limited thereto. Also, the CGL 240 may be referred to as an organic layer.

In an organic light emitting display device including the organic light emitting device according to the first embodiment of the present disclosure, a pixel area may be defined on the substrate 201 by a gate line and a data line. A power line which extends in parallel with one among the gate line and the data line may be disposed on the substrate 201, and a switching thin film transistor (TFT) connected to the gate line or the data line and a driving TFT connected to the switching TFT may be disposed in the pixel area. The driving TFT may be connected to the first electrode 202. Also, the organic light emitting device according to the first embodiment of the present disclosure may be applied to a bottom emission display device, a top emission display device, a dual emission display device, etc. Also, the organic light emitting device according to the first embodiment of the present disclosure may be applied to a lighting apparatus for vehicles, thereby providing a lighting apparatus for vehicles, in which lifetime stability is secured at a high temperature.

Therefore, in order to enhance lifetime at the room temperature and the high temperature, the second EML may include at least two zones, and in a first zone of the at least two zones close to the first electrode, a ratio of the mixed host to the electron-type host may be adjusted higher than a ratio of the mixed host to the hole-type host. Also, in a second zone of the at least two zones close to the second electrode, a ratio of the mixed host to the hole-type host may be adjusted equal to or higher than a ratio of the mixed host to the electron-type host.

In FIG. 4, the organic light emitting device has been described above as including two emission parts, but is not limited thereto. In another embodiment, in order to further enhance blue efficiency, an emission part including a blue EML may be added, and thus, the organic light emitting device may include three emission parts. An organic light emitting device including three emission parts will be described with reference to FIG. 5. However, the present embodiment is not limited thereto, and an organic light emitting device may include three or more emission parts depending on the characteristic or structure of the organic light emitting device.

Figure 5:
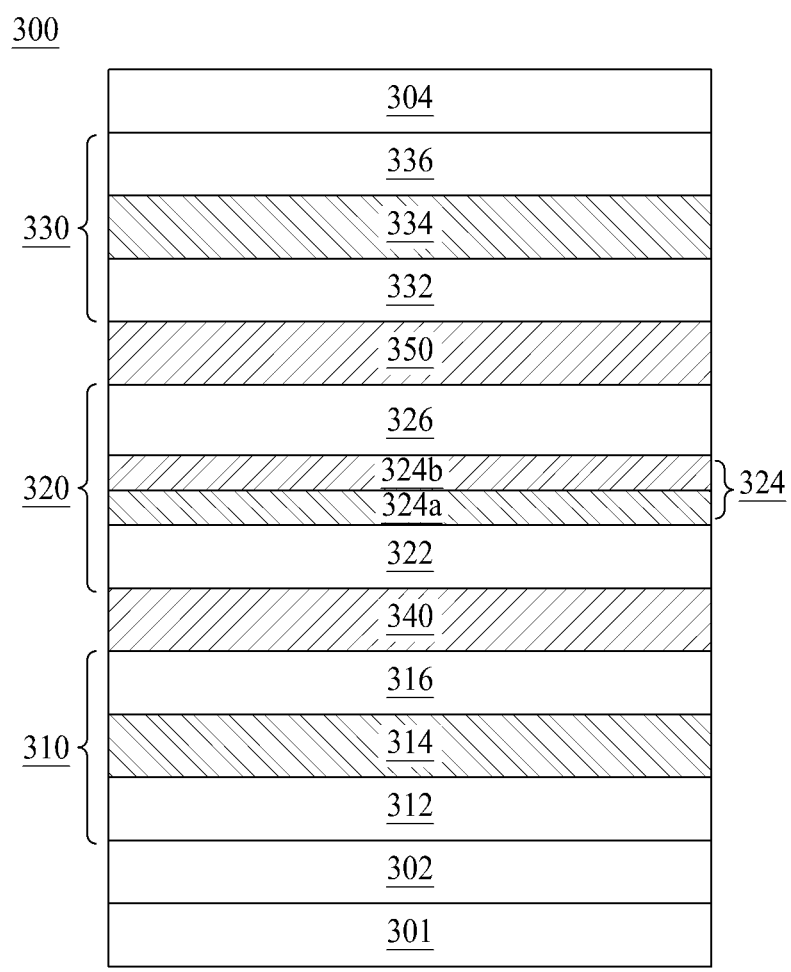
FIG. 5 is a diagram illustrating an organic light emitting device according to a second embodiment of the present disclosure.

FIG. 5 is a diagram illustrating an organic light emitting device 300 according to a second embodiment of the present disclosure.

The organic light emitting device 300 according to the second embodiment of the present disclosure may include a substrate 301, first and second electrodes 302 and 304, and first to third emission parts 310, 320 and 330 between the first and second electrodes 302 and 304. The first substrate 301, first electrode 302, second electrode 304, and first emission part 310 of FIG. 5 may be substantially the same as the first substrate 201, the first electrode 202, the second electrode 204, and the first emission part 210 described above with reference to FIG. 4. Thus, detailed descriptions of the first substrate 301, first electrode 302, and second electrode 304 of FIG. 5 are omitted or minimized.

The first emission part 310 may include a HTL 312, a first EML 314, and a first ETL 316 which are disposed on the first electrode 302. That is, a first layer which includes the first HTL 312, the first EML 314, and the first ETL 316 may be formed on the first electrode 302. Also, a hole supplied through the first HTL 312 and an electron supplied through the first ETL 316 may be recombined in the first EML 314 to generate an exciton. A zone where the exciton is generated may be referred to as a recombination zone or an emission zone (an emission area).

The first EML 314 may be an emission layer emitting light having a first color. That is, the first EML 314 may include one among a blue emission layer, a deep blue emission layer, and a sky blue emission layer. An emission zone of the first EML 314 may be within a range of 440 nm to 480 nm.

The first EML 314 may be formed of a blue emission layer which includes an auxiliary emission layer emitting light having a color different from that of light emitted from the blue emission layer. The auxiliary emission layer may be configured with one among a yellow-green emission layer and a red emission layer, or may be configured by a combination thereof. When the auxiliary emission layer is further provided, green or red efficiency can be further improved. When the first EML 314 is provided along with the auxiliary emission layer, the yellow-green emission layer, the red emission layer, or a green emission layer may be disposed on or under the blue emission layer. Also, the yellow-green emission layer, the red emission layer, or the green emission layer may be identically or differently provided as the auxiliary emission layer on and under the blue emission layer. The positions or number of emission layers may be selectively determined depending on a structure and a characteristic of a device, but the present embodiment is not limited thereto.

When the first EML 314 includes the yellow-green emission layer which is the auxiliary emission layer, an emission zone of the first EML 314 may be within a range of 440 nm to 590 nm. Also, when the first EML 314 includes the red emission layer which is the auxiliary emission layer, the emission zone of the first EML 314 may be within a range of 440 nm to 650 nm. Also, when the first EML 314 includes the yellow-green emission layer and the red emission layer which configure the auxiliary emission layer, the emission zone of the first EML 314 may be within a range of 440 nm to 650 nm. Therefore, the first EML 314 may include one among a blue emission layer, a deep blue emission layer, a sky blue emission layer, a combination of a red emission layer and one among a blue emission layer, a deep blue emission layer and a sky blue emission layer, and a combination of a yellow-green emission layer and one among a blue emission layer, a deep blue emission layer and a sky blue emission layer.

The first EML 314 may include at least one host and dopant. Alternatively, the first EML 314 may include a mixed host, where two or more hosts are mixed, and at least one dopant. The mixed host may include a hole-type host and an electron-type host.

The first HTL 312, the first EML 314, the first ETL 316, the HIL, the EIL, the HBL, and the EBL may each be referred to as an organic layer.

The second emission part 320 may include a second HTL 322, a second EML 324, and a second ETL 326 which are disposed on the first emission part 310. Alternatively, a second layer which includes the second HTL 322, the second EML 324, and the second ETL 326 may be disposed on the first layer which includes the first HTL 312, the first EML 314, and the first ETL 316. A hole supplied through the second HIL 322 and an electron supplied through the second ETL 326 may be recombined in the second EML 324 to generate an exciton. A zone where the exciton is generated may be referred to as a recombination zone or an emission zone (an emission area).

An EIL may be further formed on the second ETL 326. Also, an HIL may be further formed under the second HTL 322.

An HBL may be further formed on the second EML 324. The second ETL 326 and the HBL may be provided as one layer.

An EBL may be further formed under the second EML 324. The second HTL 322 and the EBL may be provided as one layer.

The second EML 324 may be an emission layer emitting light having a second color. That is, the second EML 324 may include one among a yellow-green emission layer and a green emission layer. When the second EML 324 is the yellow-green emission layer, an emission zone of the second EML 324 may be within a range of 510 nm to 590 nm. Also, when the second EML 324 is the green emission layer, the emission zone of the second EML 324 may be within a range of 510 nm to 580 nm.

The second EML 324 may include at least one host and dopant. The at least one host may include a hole-type host or an electron-type host. Also, the second EML 324 may include at least two zones. In FIG. 5, the second EML 324 is illustrated as including two zones, but the present embodiment is not limited thereto. In another embodiment, the second EML 324 may include three or more zones. Accordingly, in the second EML 324, a ratio of the mixed host to the hole-type host a ratio of the mixed host to the electron-type host included in at least two zones may be differently adjusted.

A first zone 324a of the at least two zones may be a zone close to the first electrode 302 through which a hole is transported, and a second zone 324b of the at least two zones may be a zone close to the second electrode 304 through which an electron is transported. Alternatively, the first zone 324a of the at least two zones may be a zone adjacent to the second HTL 322, and the second zone 324b of the at least two zones may be a zone adjacent to the second ETL 326. As a temperature increases to a high temperature, electrical charges are excessively concentrated on the first zone 324a, and the number of electrons supplied to the second zone 324b increases. To solve such a problem, a ratio of the mixed host to the hole-type host and a ratio of the mixed host to the electron-type host may be differently adjusted in the first zone 324a and the second zone 324b. That is, in the first zone 324a, a ratio of the mixed host to the electron-type host where a change amount of mobility caused by a temperature is large may be adjusted higher than a ratio of the mixed host to the hole-type host. Therefore, the first zone 324a may control the number of increased holes, and thus, electrons which are transferred from the second zone 324b and are concentrated on the first zone 324a are effectively dispersed to the second zone 324b, thereby achieving a balance of electrons and holes in the second EML 324. In the second zone 324b, a ratio of the mixed host to the hole-type host may be adjusted equal to or higher than a ratio of the mixed host to the electron-type host. Therefore, the second zone 324b may minimize the number of increased electrons, and thus, holes in the first zone 324a are effectively dispersed to the second zone 324b, thereby achieving a balance of electrons and holes in the second EML 324.

Therefore, a ratio of the mixed host to the electron-type host may be adjusted higher than a ratio of the mixed host to the hole-type host in the first zone 324a adjacent to the second HTL 322, and thus, the number of increased holes in the first zone 324a may be controlled, whereby electrons which are transferred from the second zone 324b and are concentrated on the first zone 324a are effectively dispersed to the second zone 324b. Also, a ratio of the mixed host to the hole-type host may be adjusted equal to or higher than a ratio of the mixed host to the electron-type host in the second zone 324b adjacent to the second ETL 326, and thus, the number of increased electrons in the second zone 324b may be controlled, whereby holes in the first zone 324a are effectively dispersed to the second zone 324b. Therefore, the second EML 324 may maintain a balance of electrons and holes at a room temperature and a high temperature, and thus may contribute to emit light, thereby enhancing lifetime.

Alternatively, in the first zone 324a of the second EML 324 close to the first electrode 302 through which a hole is transported, a ratio of the mixed host to the electron-type host may be adjusted higher than a ratio of the mixed host to the hole-type host. Also, in the second zone 324b of the second EML 324 close to the second electrode 304 through which an electron is transported, a ratio of the mixed host to the hole-type host may be adjusted equal to or higher than a ratio of the mixed host to the electron-type host. Accordingly, a ratio of electrons and holes may be adjusted, and thus, an emission zone of the second EML 324 is optimized, thereby enhancing lifetime at a high temperature.

Alternatively, in the first zone 324a of the second EML 324 close to the second HTL 322, a ratio of the mixed host to the electron-type host may be adjusted higher than a ratio of the mixed host to the hole-type host. Also, in the second zone 324b of the second EML 324 close to the second ETL 326, a ratio of the mixed host to the hole-type host may be adjusted equal to or higher than a ratio of the mixed host to the electron-type host. Accordingly, a ratio of electrons and holes may be adjusted, and thus, the emission zone of the second EML 324 is optimized, thereby enhancing lifetime at a high temperature. Also, examples of the materials described above with reference to FIG. 4 may be applied to the hole-type host and the electron-type host.

The second HTL 322, the second EML 324, the second ETL 326, the HIL, the EIL, the HBL, and the EBL may each be referred to as an organic layer.

A first charge generation layer (CGL) 340 may be further provided between the first emission part 310 and the second emission part 320. Alternatively, the first CGL 340 may be further provided between the first layer, including the first HTL 312, the first EML 314, and the first ETL 316, and the second layer which includes the second HTL 322, the second EML 324, and the second ETL 326. The first CGL 340 may adjust a charge balance between the first emission part 310 and the second emission part 320.

The first CGL 340 may include an N-type CGL and a P-type CGL. The N-type CGL may inject an electron into the first emission part 310. The N-type CGL may be formed as an organic layer which is doped with alkali metal such as lithium (Li), sodium (Na), potassium (K), or cesium (Cs) or alkali earth metal such as magnesium (Mg), strontium (Sr), barium (Ba), or radium (Ra), but is not limited thereto. The P-type CGL may inject a hole into the second emission part 320. The P-type CGL may be formed as an organic layer including a P-type dopant, but is not limited thereto. Also, the first CGL 340 may be referred to as an organic layer.

The third emission part 330 may include a third HTL 332, a third EML 334, and a third ETL 336 which are disposed on the second emission part 320. That is, a third layer which includes the third HTL 332, the third EML 334, and the third ETL 336 may be formed on the second layer which includes the second HTL 322, the second EML 324, and the second ETL 326. Also, a hole supplied through the third HTL 332 and an electron supplied through the third ETL 336 may be recombined in the third EML 334 to generate an exciton. A zone where the exciton is generated may be referred to as a recombination zone or an emission zone (an emission area).

An EIL may be further formed on the third ETL 336. Also, an HIL may be further formed under the third HTL 332.

The third EML 334 may be an emission layer emitting light having the same color as the first color, for enhancing blue efficiency. That is, the third EML 334 may include one of a blue emission layer, a deep blue emission layer, and a sky blue emission layer. An emission zone of the third EML 334 may be within a range of 440 nm to 480 nm.

The third EML 334 may be formed of a blue emission layer which includes an auxiliary emission layer emitting light having a color different from that of light emitted from the blue emission layer. The auxiliary emission layer may be configured with one among a yellow-green emission layer and a red emission layer, or may be configured by a combination thereof. When the auxiliary emission layer is further provided, green or red efficiency can be further improved. When the third EML 334 is provided along with the auxiliary emission layer, the yellow-green emission layer, the red emission layer, or a green emission layer may be disposed on or under the blue emission layer. Also, the yellow-green emission layer, the red emission layer, or the green emission layer may be identically or differently provided as the auxiliary emission layer on and under the blue emission layer. The positions or number of emission layers may be selectively determined depending on a structure and a characteristic of a device, but the present embodiment is not limited thereto. Also, when the third EML 334 includes the auxiliary emission layer, the emission zone of the third EML 334 may be within a range of 440 nm to 650 nm. Therefore, the third EML 334 may include one of a blue emission layer, a deep blue emission layer, a sky blue emission layer, a combination of a red emission layer and one among a blue emission layer, a deep blue emission layer and a sky blue emission layer, and a combination of a yellow-green emission layer and one among a blue emission layer, a deep blue emission layer and a sky blue emission layer.

The third EML 334 may include at least one host and dopant. Alternatively, the third EML 334 may include a mixed host, where two or more hosts are mixed, and at least one dopant. The mixed host may include a hole-type host and an electron-type host.

An HBL may be further formed on the third EML 334. The HBL prevents a hole, injected into the third EML 334, from being transferred to the third ETL 336 and thus enhances a combination of an electron and a hole in the third EML 334, thereby enhancing the emission efficiency of the third EML 334. The third ETL 336 and the HBL may be provided as one layer.

An EBL may be further formed under the third EML 334. The EBL prevents an electron, injected into the third EML 334, from being transferred to the third HTL 332 and thus enhances a combination of an electron and a hole in the third EML 334, thereby enhancing the emission efficiency of the third EML 334. The third HTL 332 and the EBL may be provided as one layer.

The third HTL 332, the third EML 334, the third ETL 336, the EIL, the HIL, the HBL, and the EBL may each be referred to as an organic layer.

A second CGL 350 may be further provided between the second emission part 320 and the third emission part 330. Alternatively, the second CGL 350 may be further provided between the second layer, including the second HTL 322, the second EML 324, and the second ETL 326, and the third layer which includes the third HTL 332, the third EML 334, and the third ETL 336.

The second CGL 350 may adjust a charge balance between the second emission part 320 and the third emission part 330. The second CGL 350 may include an N-type CGL and a P-type CGL. The N-type CGL may inject an electron into the second emission part 320, and the P-type CGL may inject a hole into the third emission part 330. The N-type CGL may be formed as an organic layer which is doped with alkali metal such as lithium (Li), sodium (Na), potassium (K), or cesium (Cs) or alkali earth metal such as magnesium (Mg), strontium (Sr), barium (Ba), or radium (Ra), but is not limited thereto. The P-type CGL may be formed as an organic layer including a P-type dopant, but is not limited thereto. Also, the second CGL 350 may be referred to as an organic layer.

In an organic light emitting display device including the organic light emitting device according to the second embodiment of the present disclosure, a pixel area may be defined on the substrate 301 by a gate line and a data line. A power line which extends in parallel with one among the gate line and the data line may be disposed on the substrate 301, and a switching TFT connected to the gate line or the data line and a driving TFT connected to the switching TFT may be disposed in the pixel area. The driving TFT may be connected to the first electrode 302. Also, the organic light emitting device according to the first embodiment of the present disclosure may be applied to a bottom emission display device, a top emission display device, a dual emission display device, etc. Also, the organic light emitting device according to the second embodiment of the present disclosure may be applied to a lighting apparatus for vehicles, thereby providing a lighting apparatus for vehicles, in which lifetime stability is secured at a high temperature.

Therefore, in order to enhance lifetime at the room temperature and the high temperature, the second EML may include at least two zones, and in a first zone of the at least two zones close to the first electrode, a ratio of the mixed host to the electron-type host may be adjusted higher than a ratio of the mixed host to the hole-type host. Also, in a second zone of the at least two zones close to the second electrode, a ratio of the mixed host to the electron-type host may be adjusted equal to or lower than a ratio of the mixed host to the hole-type host.

Figure 6:
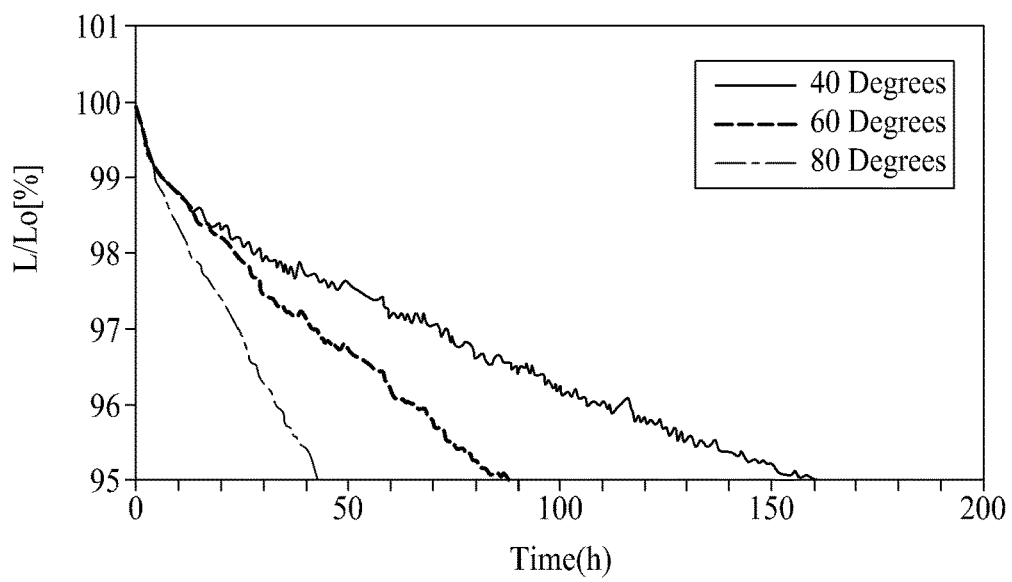
FIG. 6 is a diagram showing a blue lifetime characteristic with respect to a temperature in a comparative example.
Figure 7:
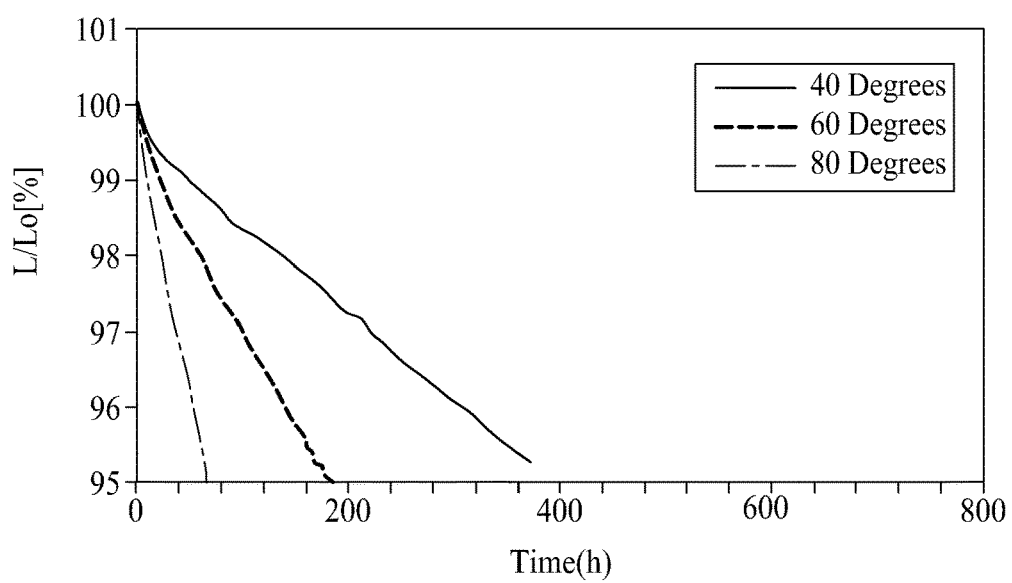
FIG. 7 is a diagram showing a yellow-green lifetime characteristic with respect to a temperature in a comparative example.
Figure 8:
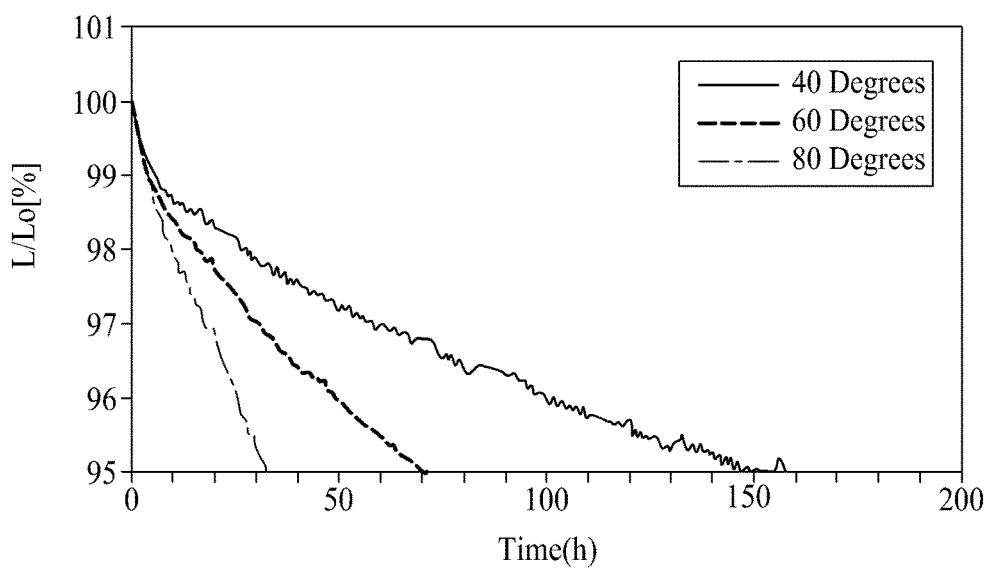
FIG. 8 is a diagram showing a blue lifetime characteristic with respect to a temperature in a first embodiment of the present disclosure.
Figure 9:
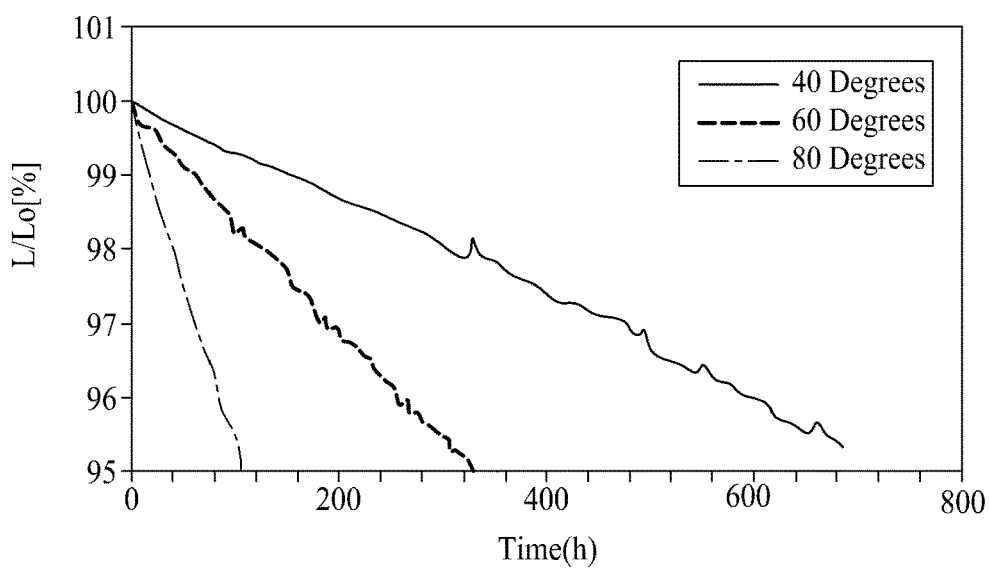
FIG. 9 is a diagram showing a yellow-green lifetime characteristic with respect to a temperature in a first embodiment of the present disclosure.
Figure 10:
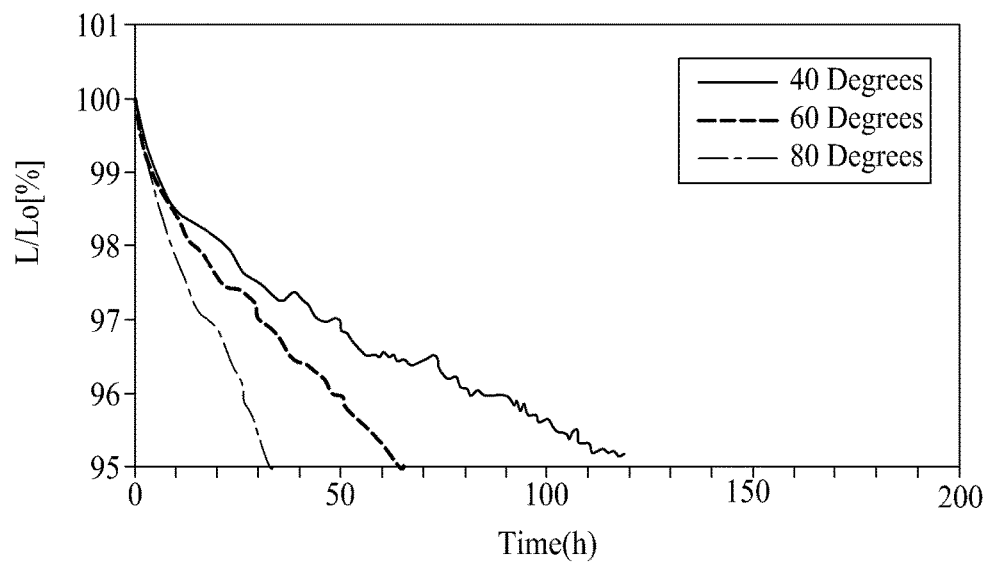
FIG. 10 is a diagram showing a blue lifetime characteristic with respect to a temperature in a second embodiment of the present disclosure.
Figure 11:
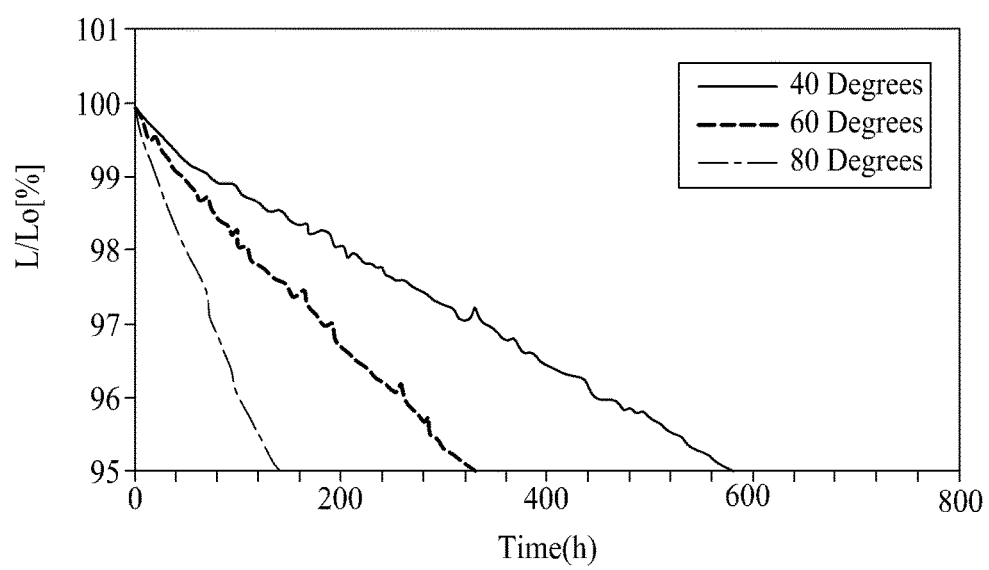
FIG. 11 is a diagram showing a yellow-green lifetime characteristic with respect to a temperature in a second embodiment of the present disclosure.

A result, obtained by measuring lifetime characteristics in a state where a ratio of hosts is differently adjusted in an EML, will be described below with reference to FIGS. 6 to 11. FIGS. 6 and 7 show results obtained by measuring a lifetime characteristic of a comparative example. FIGS. 8 and 9 show results obtained by measuring a lifetime characteristic according to a first embodiment of the present disclosure. FIGS. 10 and 11 show results obtained by measuring a lifetime characteristic according to a second embodiment of the present disclosure.

In the comparative example, the organic light emitting device of FIG. 5 is applied, and a ratio of the mixed host to the hole-type host and a ratio of the mixed host to the electron-type host included in the second EML 324 are differently adjusted. That is, a ratio of the mixed host to the hole-type host and a ratio of the mixed host to the electron-type host are identically adjusted in the first zone 324a and second zone 324b of the second EML 324. Here, a ratio of the hole-type host to the electron-type host is 5:5. A method of forming the first zone 324a of the second EML 324 provides a first set, which includes a first evaporation source for forming a hole-type host of the second EML 324, a second evaporation source for forming an electron-type host, and a third evaporation source for forming a dopant, on a substrate. Also, a method of forming the second zone 324b of the second EML 324 provides a second set, which includes a first evaporation source for forming a hole-type host of the second EML 324, a second evaporation source for forming an electron-type host, and a third evaporation source for forming a dopant, on the substrate. In the first set, the first evaporation source includes a hole-type host material, the second evaporation source includes an electron-type host material, and the third evaporation source includes a dopant material. The hole-type host material of the first evaporation source, the electron-type host material of the second evaporation source, and the dopant material of the third evaporation source are formed on the substrate in a thermal evaporation process while moving the substrate, thereby forming the first zone 324a. The second zone 324b is formed by performing the method, performed on the first set, on the second set. Also, a ratio of the hole-type host to the electron-type host may be referred to as a volume ratio. In a process of forming an organic layer through thermal evaporation, on the assumption that the organic layer is formed by 0.1 nm (0.1 nm/sec) per one second, when a ratio of the hole-type host hole-type-hosts to the electron-type host is 5:5, a hole-type host is formed by 0.05 nm, and an electron-type host is formed by 0.05 nm, with respect to 0.1 nm (0.1 mm/sec) per one second. Therefore, in a process of forming the second EML 324, when a ratio of the hole-type host to the electron-type host is 5:5, a hole-type host is formed at a deposition rate of 0.05 nm/sec, and an electron-type host is formed at a deposition rate of 0.05 nm/sec (i.e., the same deposition rate as that of hole-type host).

In the first embodiment, the organic light emitting device of FIG. 5 is applied, and a ratio of the mixed host to the hole-type host and a ratio of the mixed host to the electron-type host included in the second EML 324 are differently adjusted. That is, a ratio of the mixed host to the hole-type host and a ratio of the mixed host to the electron-type host are differently adjusted in the first zone 324a of the second EML 324, and a ratio of the mixed host to the hole-type host hole-type-hosts and a ratio of the mixed host to the electron-type host are identically adjusted in the second zone 324b of the second EML 324. Here, a ratio of the hole-type host to the electron-type host in the first zone 324a is 3.5:6.5. Also, a ratio of the hole-type host to the electron-type host electron-type-hosts in the second zone 324b is 5:5. Therefore, a ratio of the mixed host to the electron-type host is adjusted higher than a ratio of the mixed host to the hole-type host in the first zone 324a, and a ratio of the mixed host to the hole-type host and a ratio of the mixed host to the electron-type host are equally adjusted in the second zone 324b. A ratio of the hole-type host ape hosts to the electron-type host does not limit details of the present disclosure. A method of forming the second zone 324b of the second EML 324 is implemented identically to the comparative example. Also, since a ratio of the hole-type host to the electron-type host in the first zone 324a is 3.5:6.5, this is identical to the comparative example, but, a deposition rate is set differently from the comparative example.

In the second embodiment, the organic light emitting device of FIG. 5 is applied, and a ratio of the mixed host to the hole-type host and a ratio of the mixed host to the electron-type host included in the second EML 324 are differently adjusted. That is, a ratio of the mixed host to the hole-type host and a ratio of the mixed host to the electron-type host are differently adjusted in the first zone 324a of the second EML 324, and a ratio of the mixed host to the hole-type host and a ratio of the mixed host to the electron-type host are differently adjusted in the second zone 324b of the second EML 324. Here, a ratio of the hole-type host to the electron-type host in the first zone 324a is 3.5:6.5. Also, a ratio of the hole-type host to the electron-type host in the second zone 324b is 6.5:3.5. Therefore, a ratio of the mixed host to the electron-type host is adjusted higher than a ratio of the mixed host to the hole-type host in the first zone 324a, and a ratio of the mixed host to the hole-type host is adjusted higher than a ratio of the mixed host to the electron-type host in the second zone 324b. a ratio of the mixed host to the hole-type host to electron-type hosts does not limit details of the present disclosure. A method of forming the first zone 324a and second zone 324b of the second EML 324 is implemented identically to the first embodiment, but in a deposition rate, the second embodiment differs from the first embodiment.

FIG. 6 is a diagram showing a blue lifetime characteristic with respect to a temperature in the comparative example. In FIG. 6, the abscissa axis indicates a time (hr), and the ordinate axis indicates a luminance drop rate (L/L0) (%). FIG. 6 shows a result that is obtained by measuring lifetime characteristic at 40° C. and 80° C.

As shown in FIG. 6, it can be seen that as a temperature increases, lifetime is reduced with respect to a time (i.e., 95% lifetime (T95) of an organic light emitting device)

taken until emission luminance corresponding to 95% of initial emission luminance is obtained. That is, when it is assumed that lifetime characteristic at 40° C. is 100%, it can be seen that lifetime characteristic is reduced by 50% at 60° C. in comparison with 100% corresponding to lifetime characteristic at 40° C. Also, when it is assumed that lifetime characteristic at 40° C. is 100%, it can be seen that lifetime characteristic is reduced by 75% at 80° C. in comparison with 100% corresponding to lifetime characteristic at 40° C. Accordingly, in the comparative example, it can be seen that blue lifetime characteristic is reduced at 80° C. rather than 60° C.

FIG. 7 is a diagram showing a yellow-green lifetime characteristic with respect to a temperature in the comparative example. In FIG. 7, the abscissa axis indicates a time (hr), and the ordinate axis indicates a luminance drop rate (L/L0) (%). FIG. 7 shows a result that is obtained by measuring lifetime characteristic at 40° C. and 80° C.

As shown in FIG. 7, it can be seen that as a temperature increases, lifetime is reduced with respect to a time (i.e., 95% lifetime (T95) of an organic light emitting device) taken until emission luminance corresponding to 95% of initial emission luminance is obtained. That is, when it is assumed that lifetime characteristic at 40° C. is 100%, it can be seen that lifetime characteristic is reduced by 63% at 60° C. in comparison with 100% corresponding to lifetime characteristic at 40° C. Also, when it is assumed that lifetime characteristic at 40° C. is 100%, it can be seen that lifetime characteristic is reduced by 85% at 80° C. in comparison with 100% corresponding to lifetime characteristic at 40° C. Accordingly, in the comparative example, it can be seen that yellow-green lifetime characteristic is further reduced at 80° C. rather than 60° C.

FIG. 8 is a diagram showing a blue lifetime characteristic with respect to a temperature in the first embodiment. In FIG. 8, the abscissa axis indicates a time (hr), and the ordinate axis indicates a luminance drop rate (L/L0) (%). FIG. 8 shows a result that is obtained by measuring lifetime characteristic at 40° C. and 80° C.

A temperature range desired by the organic light emitting display device may be a range of 60° C. to 105° C. The temperature range may be referred to as a temperature range which is used under a certain environment condition of a user using the organic light emitting display device, and may be changed depending on an environment condition of the user. Also, when the temperature range is applied to a lighting apparatus for vehicles, the temperature range may be a range of −40° C. to 105° C. depending on a temperature change of an external environment. To describe lifetime characteristic results of the embodiments 1 and 2 of the present disclosure, lifetime characteristic at 80° C. has been measured, but lifetime characteristic at 105° C. is similar to lifetime characteristic at 80° C.

As shown in FIG. 8, it can be seen that as a temperature increases, lifetime is reduced with respect to a time (i.e., 95% lifetime (T95) of an organic light emitting device) taken until emission luminance corresponding to 95% of initial emission luminance is obtained. That is, when it is assumed that lifetime characteristic at 40° C. is 100%, it can be seen that lifetime characteristic is reduced by 53% at 60° C. in comparison with 100% corresponding to lifetime characteristic at 40° C. Also, when it is assumed that lifetime characteristic at 40° C. is 100%, it can be seen that lifetime characteristic is reduced by 73% at 80° C. in comparison with 100% corresponding to lifetime characteristic at 40° C. Accordingly, in the first embodiment, it can be seen that blue lifetime characteristic is enhanced at 60° C. rather than 80° C. Also, it can be seen that blue lifetime characteristic is enhanced at 80° C. in comparison with the comparative example.

FIG. 9 is a diagram showing a yellow-green lifetime characteristic with respect to a temperature in the first embodiment. In FIG. 9, the abscissa axis indicates a time (hr), and the ordinate axis indicates a luminance drop rate (L/L0) (%). FIG. 9 shows a result that is obtained by measuring lifetime characteristic at 40° C. and 80° C.

As shown in FIG. 9, it can be seen that as a temperature increases, lifetime is reduced with respect to a time (i.e., 95% lifetime (T95) of an organic light emitting device) taken until emission luminance corresponding to 95% of initial emission luminance is obtained. That is, when it is assumed that lifetime characteristic at 40° C. is 100%, it can be seen that lifetime characteristic is reduced by 54% at 60° C. in comparison with 100% corresponding to lifetime characteristic at 40° C. Also, when it is assumed that lifetime characteristic at 40° C. is 100%, it can be seen that lifetime characteristic is reduced by 86% at 80° C. in comparison with 100% corresponding to lifetime characteristic at 40° C. Accordingly, in the first embodiment, it can be seen that yellow-green lifetime characteristic is enhanced at 60° C. rather than 80° C. Also, it can be seen that yellow-green lifetime characteristic is enhanced at 60° C. in comparison with the comparative example.

FIG. 10 is a diagram showing a blue lifetime characteristic with respect to a temperature in the second embodiment of the present disclosure. In FIG. 10, the abscissa axis indicates a time (hr), and the ordinate axis indicates a luminance drop rate (L/L0) (%). FIG. 10 shows a result that is obtained by measuring lifetime characteristic at 40° C. and 80° C.

As shown in FIG. 10, it can be seen that as a temperature increases, lifetime is reduced with respect to a time (i.e., 95% lifetime (T95) of an organic light emitting device) taken until emission luminance corresponding to 95% of initial emission luminance is obtained. That is, when it is assumed that lifetime characteristic at 40° C. is 100%, it can be seen that lifetime characteristic is reduced by 52% at 60° C. in comparison with 100% corresponding to lifetime characteristic at 40° C. Also, when it is assumed that lifetime characteristic at 40° C. is 100%, it can be seen that lifetime characteristic is reduced by 76% at 80° C. in comparison with 100% corresponding to lifetime characteristic at 40° C. Accordingly, in the second embodiment, it can be seen that blue lifetime characteristic is enhanced at 60° C. rather than 80° C.

FIG. 11 is a diagram showing a yellow-green lifetime characteristic with respect to a temperature in the second embodiment of the present disclosure. In FIG. 11, the abscissa axis indicates a time (hr), and the ordinate axis indicates a luminance drop rate (L/L0) (%). FIG. 11 shows a result that is obtained by measuring a lifetime characteristic at 40° C. and 80° C.

As shown in FIG. 11, it can be seen that as a temperature increases, lifetime is reduced with respect to a time (i.e., 95% lifetime (T95) of an organic light emitting device) taken until emission luminance corresponding to 95% of initial emission luminance is obtained. That is, when it is assumed that lifetime characteristic at 40° C. is 100%, it can be seen that lifetime characteristic is reduced by 53% at 60° C. in comparison with 100% corresponding to lifetime characteristic at 40° C. Also, when it is assumed that lifetime characteristic at 40° C. is 100%, it can be seen that lifetime characteristic is reduced by 79% at 80° C. in comparison with 100% corresponding to lifetime characteristic at 40° C.

Accordingly, in the second embodiment, it can be seen that yellow-green lifetime characteristic is enhanced at 60° C. rather than 80° C. Also, it can be seen that yellow-green lifetime characteristic is further enhanced at 80° C. in comparison with the comparative example.

Through the results obtained by measuring a lifetime characteristic, a second EML including at least two zones are provided, and a ratio of the mixed host to the electron-type host and a ratio of the mixed host to the hole-type host included in the at least two zones are differently adjusted, whereby it can be seen that lifetime at the room temperature and the high temperature is enhanced. That is, in the first embodiment, a ratio of the mixed host to the electron-type host is adjusted higher a ratio of the mixed host to the hole-type host in a first zone of the at least two zones close to a first electrode, and a ratio of the mixed host to the hole-type host is adjusted equal to a ratio of the mixed host to the electron-type host in a second zone of the at least two zones close to a second electrode. Therefore, it can be seen that lifetime of a blue EML or a yellow-green EML is enhanced at 25° C. which is the room temperature and at a higher temperature equal to or less than 105° C. Also, in the second embodiment, a ratio of the mixed host to the electron-type host is adjusted higher than a ratio of the mixed host to the hole-type host in the first zone of the at least two zones close to the first electrode, and a ratio of the mixed host to the hole-type host is adjusted higher than a ratio of the mixed host to the electron-type host in the second zone of the at least two zones close to the second electrode. Accordingly, it can be seen that lifetime of the blue EML or the yellow-green EML is further enhanced at 25° C. which is the room temperature and at a higher temperature equal to or less than 105° C.

Figure 12:
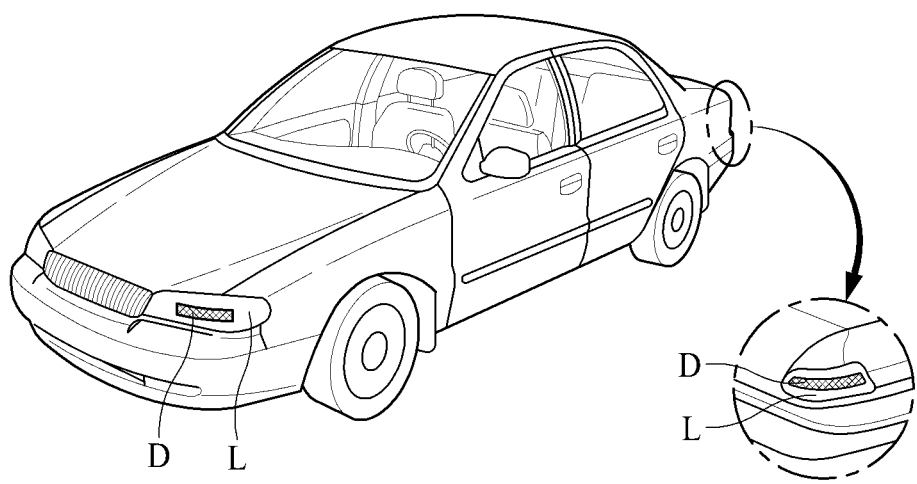
FIG. 12 is a diagram illustrating a lighting apparatus for vehicles according to an embodiment of the present disclosure.

FIG. 12 is a diagram illustrating a lighting apparatus L for vehicles according to an embodiment of the present disclosure. All the components of the lighting apparatus are operatively coupled and configured.

The vehicle lighting apparatus L of FIG. 12 may be mounted on a front surface or a rear surface of a vehicle and may secure a front view or a rear view of a driver when the vehicle is driving. The vehicle lighting apparatus L according to another embodiment of the present disclosure may be at least one among headlights, a high beam, taillights, a brake light, a back-up light, a fog lamp, a turn signal light, and an auxiliary lamp, but is not limited thereto. Alternatively, the vehicle lighting apparatus L may be applied to all indicator lamps which are used to secure a field of view of a driver and transmit or receive a signal of a vehicle. The drawing of FIG. 12 does not limit vehicle lighting applied to the vehicle lighting apparatus L according to the present embodiment.

The vehicle lighting apparatus L according to the present embodiment may include an organic light emitting device D, may surface-emit light, and may have a flexible structure. The organic light emitting device D included in the vehicle lighting apparatus L may have the structure described above with reference to FIGS. 4, 5 and 8 to 11. The organic light emitting device D may include an HTL, an EML, and an ETL which are disposed between an anode and a cathode. The EML may be provided as one or more, and the one or more EMLs may include EMLs that emit lights having the same color. Alternatively, the one or more EMLs may include EMLs that emit lights having different colors.

Moreover, the organic light emitting device D may include an emission layer including at least two zones, and a ratio of the mixed host to the electron-type host and a ratio of the mixed host to the hole-type host included in the at least two zones may be differently adjusted, whereby a charge balance of the emission layer may be adjusted depending on a change in a temperature when a vehicle drives at the room temperature or the high temperature. Accordingly, provided is a lighting apparatus for vehicles, which maintains enhanced lifetime when a vehicle drives at the room temperature or the high temperature.

Moreover, according to the embodiments of the present disclosure, since a ratio of the mixed host to the electron-type host and a ratio of the mixed host to the hole-type host included in an emission layer including at least two zones are differently adjusted, a charge balance of electrons and holes in the emission layer may be adjusted, thereby providing an organic light emitting display device or a lighting apparatus for vehicles, which have enhanced lifetime.

Alternatively, according to the embodiments of the present disclosure, since a ratio of the mixed host to the electron-type host included in an emission layer in a zone adjacent to an HTL is adjusted higher than a ratio of the mixed host to the hole-type host, a charge balance of electrons and holes in the emission layer may be adjusted, thereby providing an organic light emitting display device or a lighting apparatus for vehicles, which have enhanced lifetime.

Alternatively, according to the embodiments of the present disclosure, since a ratio of the mixed host to the electron-type host included in an emission layer in a zone adjacent to an HTL is adjusted equal to or lower than a ratio of the mixed host to the hole-type host, a charge balance of electrons and holes in the emission layer may be adjusted, thereby providing an organic light emitting display device or a lighting apparatus for vehicles, which have enhanced lifetime.

Alternatively, according to the embodiments of the present disclosure, a ratio of the mixed host to the electron-type host and a ratio of the mixed host to the hole-type host hole type hosts included in an emission layer including at least two zones are differently adjusted, a difference in carrier mobility caused by a temperature change of a room-temperature and a high-temperature environment relevant to a vehicle is prevented from occurring, and thus, a charge balance of the emission layer may be adjusted, thereby providing a lighting apparatus for vehicles, which is driven at the room temperature and the high temperature.

Alternatively, according to the embodiments of the present disclosure, since a ratio of the mixed host to the electron-type host and a ratio of the mixed host to the hole-type host included in an emission layer including at least two zones are differently adjusted, an emission zone does not move despite a carrier mobility difference at the high temperature, thereby providing an organic light emitting display device or a lighting apparatus for vehicles, in which lifetime stability is secured at the high temperature.

It will be apparent to those skilled in the art that various modifications and variations can be made in the present disclosure without departing from the spirit or scope of the disclosure. Thus, it is intended that the present invention covers the modifications and variations of this disclosure provided they come within the scope of the appended claims and their equivalents.

What is claimed is:

1. An organic light emitting display device comprising:
a first emission part between an anode electrode and a cathode electrode, the first emission part including a first hole transport layer, a first emission layer, and a first electron transport layer, the first emission part disposed on the anode electrode;

a second emission part on the first emission part, the second emission part including a second hole transport layer, a second emission layer, and a second electron transport layer; and a third emission part on the second emission part, the third emission part including a third hole transport layer, a third emission layer, and a third electron transport layer, wherein the second emission part is disposed between the first emission part and the third emission part, the second emission layer of the second emission part includes a green or yellow-green emission layer and the first and third emission layers of the first and third emission parts each include a blue emission layer, and an emission zone of the second emission layer is within a range of 510 nm to 590 nm, wherein the second emission layer comprises at least two zones including a mixed host having a hole-type host and an electron-type host, and a first zone among the at least two zones is closer to the anode electrode than the cathode electrode, wherein a ratio of the hole-type host to the electron-type host in the first zone is a:b, where a is smaller than b, and wherein a second zone among the at least two zones is closer to the cathode electrode than the anode electrode, the second zone is located between the first zone and the cathode electrode, and a ratio of the hole-type host to the electron-type host in the second zone is c:d, where c is equal to or larger than d, and the second zone is configured to maintain a balance of electrons and holes and the emission zone of the second emission layer at a room temperature and at a high temperature that is higher than the room temperature.

2. The organic light emitting display device of claim 1, wherein the blue emission layer of the first and third emission layers is a sky blue emission layer or a deep blue emission layer.

3. The organic light emitting display device of claim 1, wherein at least one of the anode electrode and the cathode electrode comprises a semitransmissive electrode.

4. The organic light emitting display device of claim 1, wherein the ratio of the hole-type host to the electron-type host in the first zone adjacent to the second hole transport layer is about 3.5:6.5.

5. The organic light emitting display device of claim 1, wherein the ratio of the hole-type host to the electron-type host in the second zone adjacent to the second electron transport layer is about 6.5:3.5.

6. The organic light emitting display device of claim 1, wherein the ratio of the hole-type host to the electron-type host is opposite to the ratio of the hole-type host to the electron-type host in the second zone.

7. A vehicle head light, vehicle taillight or vehicle indicator lamp including the organic light emitting display device of claim 1.

8. The organic light emitting display device of claim 1, wherein the electrons concentrate in the first zone and the electrons in the first zone move to the second zone at the high temperature, wherein the ratio of the hole-type host to the electron-type host in the second zone is about 6.5:3.5 to maintain the balance of the electrons and the holes in the second zone, and wherein the ratio of the hole-type host to the electron-type host in the first zone is about 3.5:6.5 to transfer the electrons in the first zone to the second zone.

9. An organic light emitting display device, comprising:
a first layer on a anode electrode, the first layer including a first hole transport layer, a first emission layer, and a first electron transport layer;
a second layer on the first layer, the second layer including a second hole transport layer, a second emission layer, and a second electron transport layer;
a third layer on the second layer, the third layer including a third hole transport layer, a third emission layer, and a third electron transport layer; and
a cathode electrode on the second layer,
wherein the second layer is disposed between the first layer and the third layer, the second emission layer of the second layer includes a green or yellow-green emission layer and the first and third emission layers of the first and third emission parts each include a blue emission layer, and an emission zone of the second emission layer is within a range of 510 nm to 590 nm,
wherein the second emission layer comprises at least two zones including a mixed host having a hole-type host and an electron-type host, and a ratio of the hole-type host to the electron-type host in a first zone among the at least two zones differs from a ratio of the hole-type host to the electron-type host in a second zone among the at least two zones so as not to reduce a lifetime of the first emission layer or the second emission layer despite a temperature change of a room-temperature and high-temperature environment,
wherein the first zone among the at least two zones is closer to the anode electrode than the cathode electrode,
wherein the ratio of the hole-type host to the electron-type host in the first zone is a:b, where a is smaller than b, and
wherein the second zone among the at least two zones is closer to the cathode electrode than the anode electrode, the second zone is located between the first zone and the cathode electrode, and the ratio of the hole-type host to the electron-type host in the second zone is c:d, where c is equal to or larger than d, and the second zone is configured to maintain a balance of electrons and holes and the emission zone of the second emission layer at a room temperature and at a high temperature that is higher than the room temperature.

10. The organic light emitting display device of claim 9, wherein the blue emission layer of the first and third emission layers is a sky blue emission layer or a deep blue emission layer.

11. The organic light emitting display device of claim 9, wherein at least one of the anode electrode and the cathode electrode comprises a semitransmissive electrode.

12. The organic light emitting display device of claim 9, wherein the temperature is 25° C. to 105° C.

13. The organic light emitting display device of claim 9, wherein the ratio of the hole-type host to the electron-type host in the first zone adjacent to the second hole transport layer is about 3.5:6.5.

14. The organic light emitting display device of claim 9, wherein the ratio of the hole-type host to the electron-type host in the second zone adjacent to the second electron transport layer is about 6.5:3.5.

15. The organic light emitting display device of claim 9, wherein the ratio of the hole-type host to the electron-type host is opposite to the ratio of the hole-type host to the electron-type host in the second zone.

16. A lighting apparatus for vehicles, the lighting apparatus comprising:

an organic light emitting device including:
a first layer on a anode electrode, the first layer including a first hole transport layer, a first emission layer, and a first electron transport layer;
a second layer on the first layer, the second layer including a second hole transport layer, a second emission layer, and a second electron transport layer;
a third layer on the second layer, the third layer including a third hole transport layer, a third emission layer, and a third electron transport layer; and
a cathode electrode on the second layer,
wherein the second layer is disposed between the first layer and the third layer, the second emission layer of the second layer includes a green or yellow-green emission layer and the first and third emission layers of the first and third emission parts each include a blue emission layer, and an emission zone of the second emission layer is within a range of 510 nm to 590 nm,
wherein the second emission layer comprises at least two zones including a mixed host having a hole-type host and an electron-type host, and a ratio of the hole-type host to the electron-type host in a first zone among the at least two zones differs from a ratio of the hole-type host to the electron-type host in a second zone among the at least two zones so as not to reduce a lifetime of the first emission layer or the second emission layer despite a temperature change of a room-temperature and high-temperature environment,
wherein the first zone among the at least two zones is closer to the anode electrode than the cathode electrode,
wherein the ratio of the hole-type host to the electron-type host in the first zone is a:b, where a is smaller than b, and
wherein the second zone among the at least two zones is closer to the cathode electrode than the anode electrode, the second zone is located between the first zone and the cathode electrode, and the ratio of the hole-type host to the electron-type host in the second zone is c:d, where c is equal to or larger than d, and the second zone is configured to maintain a balance of electrons and holes and the emission zone of the second emission layer at a room temperature and at a high temperature that is higher than the room temperature.

17. The lighting apparatus of claim 16, wherein one of the anode and the cathode comprises a semitransmissive electrode.

18. The lighting apparatus of claim 16, wherein the temperature is 25° C. to 105° C.

19. The lighting apparatus of claim 16, wherein the ratio of the hole-type host to the electron-type host in the first zone adjacent to the second hole transport layer is about 3.5:6.5.

20. The lighting apparatus of claim 16, wherein the ratio of the hole-type host to the electron-type host in the second zone adjacent to the second electron transport layer is about 6.5:3.5.

21. The lighting apparatus of claim 16, wherein the ratio of the hole-type host to the electron-type host is opposite to the ratio of the hole-type host to the electron-type host in the second zone.

* * * * *